United States Patent

Khoury et al.

Patent Number: 6,127,831
Date of Patent: *Oct. 3, 2000

[54] METHOD OF TESTING A SEMICONDUCTOR DEVICE BY AUTOMATICALLY MEASURING PROBE TIP PARAMETERS

[75] Inventors: Theodore Andrew Khoury, Austin; Raun L. Goode, Pflugerville; Larry J. Bustos, Elgin, all of Tex.

[73] Assignee: Motorola, Inc., Schaumburg, Ill.

[ * ] Notice: This patent issued on a continued prosecution application filed under 37 CFR 1.53(d), and is subject to the twenty year patent term provisions of 35 U.S.C. 154(a)(2).

[21] Appl. No.: 08/844,577

[22] Filed: Apr. 21, 1997

[51] Int. Cl.⁷ ..................................................... G01R 31/02
[52] U.S. Cl. ............................................ 324/754; 324/765
[58] Field of Search .................................. 324/72.5, 754, 324/757, 758, 765; 438/14, 18; 257/40, 48; 134/2–3, 41; 15/4–6, 21.1, 97.1, 40

[56] References Cited

U.S. PATENT DOCUMENTS

| | | | |
|---|---|---|---|
| 3,628,144 | 12/1971 | Aronstein et al. | 324/754 |
| 4,195,259 | 3/1980 | Reid et al. | 324/754 |
| 4,590,422 | 5/1986 | Milligan | 15/1 |
| 4,673,839 | 6/1987 | Veenendaal | 324/754 |
| 4,918,374 | 4/1990 | Stewart et al. | 324/758 |
| 5,065,092 | 11/1991 | Sigler | 324/758 |
| 5,220,279 | 6/1993 | Nagasawa | 324/754 |
| 5,561,377 | 10/1996 | Strid et al. | 324/754 |
| 5,659,255 | 8/1997 | Strid et al. | 324/754 |
| 5,778,485 | 7/1998 | Sano et al. | 15/301 |
| 5,968,282 | 10/1999 | Yamasaka | 324/754 |

*Primary Examiner*—Vinh P. Nguyen

[57] ABSTRACT

An integrated probe tip (20) parameter measuring device (70) is integrated onto the chuck (24) or substrate holder of a probe test station (10). Probe tip (20) force can be simultaneously measured for either a single probe tip, several probe, or all of the probe tips on a probe card (18). Integrating the measurement of probe tip (20) parameters such as probe tip force into a test station (10) yields real-time data about the probe process and allows feedback between measured probe tip parameters and probe chuck overdrive in the vertical direction. This integrated testing is done by periodically testing probe tip (20) parameters during the probing of die (26) on a wafer (22).

17 Claims, 4 Drawing Sheets

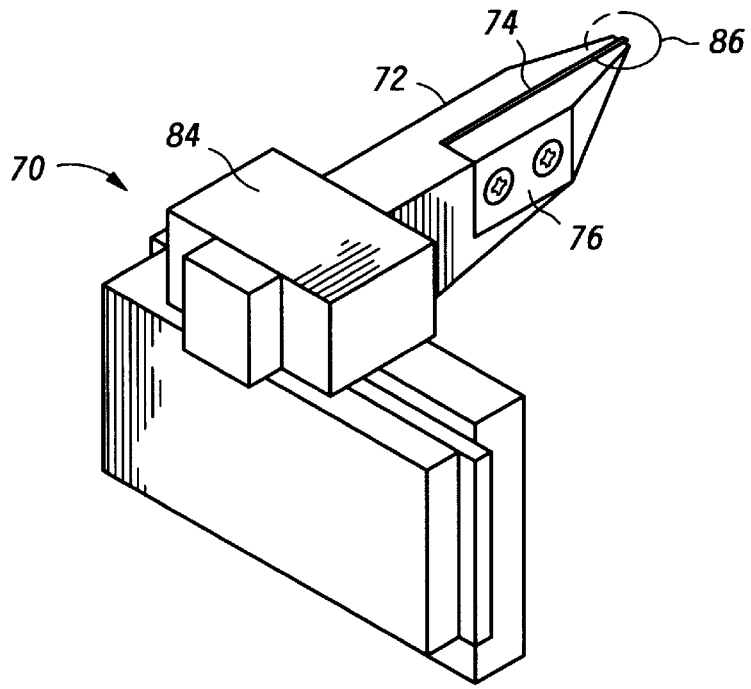
*FIG. 4*
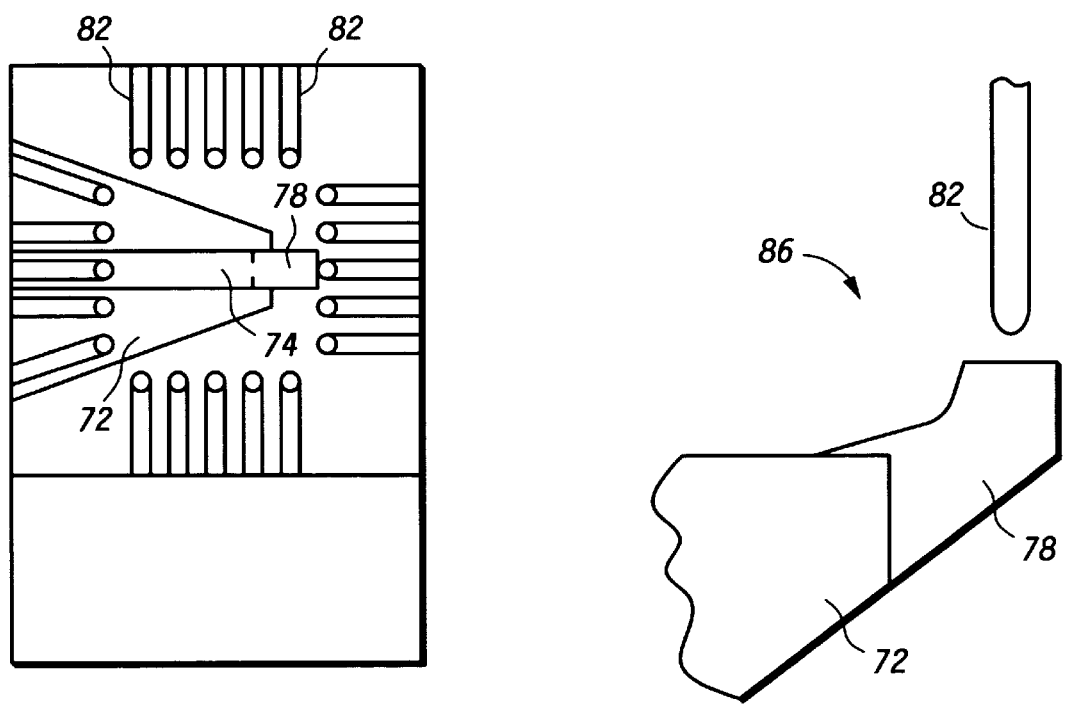
*FIG. 5*   *FIG. 6*

METHOD OF TESTING A SEMICONDUCTOR DEVICE BY AUTOMATICALLY MEASURING PROBE TIP PARAMETERS

FIELD OF THE INVENTION

The present invention generally relates to testing semiconductor devices, and more specifically to a method of testing semiconductor devices that includes automatically measuring and adjusting probe tip parameters including spring tension and electrical resistance.

BACKGROUND OF THE INVENTION

One of the steps in the manufacturing of integrated circuits is called "probe". After the finished processing of a wafer, the wafer has to be tested with a probe card at a prober station in order to electrically test the performance of each die before it is packaged. At this point, die that fail in probe are marked as defective and ultimately discarded. A die can fail for a number of reasons. One such cause of failure could be due to hardware failure, when the die in fact could be perfectly good.

A prober provides a means for a die in a wafer to make electrical contact with a probe card which is connected to test hardware. Currently, probe cards have a number of probe tips that contact either bond pads peripherally or bumps in array form on a die. It is often necessary for the probe tips to scrape an oxidation layer off the bond pad or bump in order to make electrical contact. This requires a certain probe tip force and an X and/or Y motion.

With today's level of integration, dies and corresponding probe cards need to make a large number of contacts. Several hundred simultaneous contact are not uncommon. One result is that probe cards contain large numbers of probe tips, each of which must make contact with the corresponding target peripheral bond pads or array bumps. Unfortunately however, it is possible that different probe tips in a given probe card will provide different contact force to the corresponding bonding pads or bumps. This results in unequal electrical contact to the die. It would be advantageous to be able to detect this problem, resolve it, and verify that it has been resolved. Currently, there is an inability to measure probe tip force on a per probe tip basis in "real time" when a probe card is installed in a probe station (where real time refers to a mid-test interrupt). It would also be advantageous if the probe tip force could be measured and translated to a spring constant as an integrated part of the probe process.

Currently, Applied Precision Inc. of Mercer Island, Wash. manufactures an off-line station capable of measuring relative force of individual probe tips. As the station is off-line, measuring and testing probe tip force cannot be integrated into the production flow.

BRIEF DESCRIPTION OF THE DRAWINGS

A better understanding of the present invention can be obtained when the following detailed description is considered in conjunction with the following drawings, in which:

FIG. 4 is an isometric view of force sensor or gauge, in accordance with the present invention;

FIG. 5 is a camera view of the force sensor and the contact ends of probe tips, in accordance with the present invention;

FIG. 6 shows a macro view of a probe tip and shim contact scenario from FIG. 4.

DETAILED DESCRIPTION

An integrated probe tip parameter measuring device is integrated onto the chuck (substrate holder) of a probe station. Probe tip force can be measured for either a single probe tip, several probe tips, or all the probe tips on a probe card. Integrating the measurement of probe tip force into a test station yields quick-time data about the probe process. One advantage that this provides is to allow feedback between measured probe tip force and chuck overdrive in the Z direction.

Figure 1:
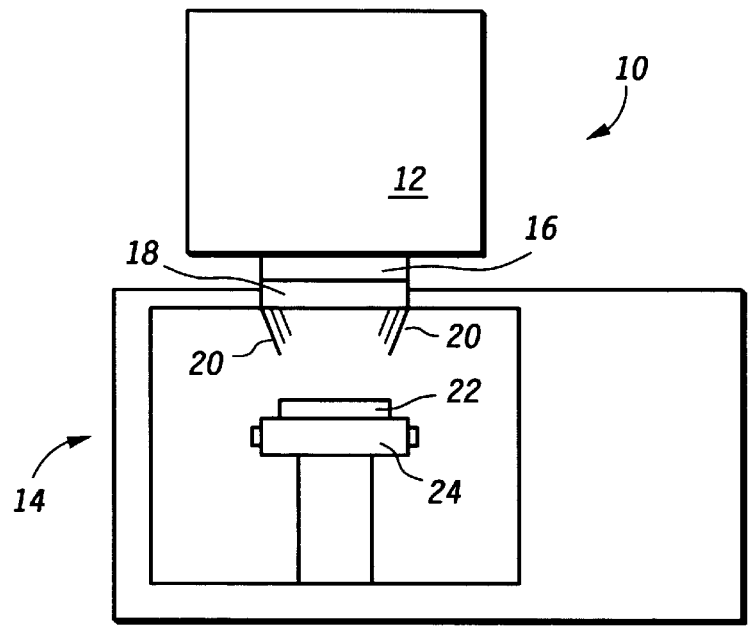
FIG. 1 is a cross-sectional view of a test station, in accordance with the present invention.

FIG. 1 is a cross-sectional view of a probe test station ("tester") 10. The tester 10 has a test head 12 and a prober 14. Connecting the test head 12 to a probe card 18 is a probe interface 16. On the bottom of the probe card 18 are probe tips 20. Some examples of probe tips 20 are cantilever probes, Cobra needle probes, and membrane bumps, and other compliant contact technologies. Other technologies are envisioned.

Probe tips 20 electrically connect device under test (DUT) in a wafer 22 to the test head 12. A prober chuck 24 moves a wafer 22, and the die 26 within the wafer 22 in X, Y, and Z directions in order to connect the probe tips 20 contact points on each individual die 26.

Figure 2:
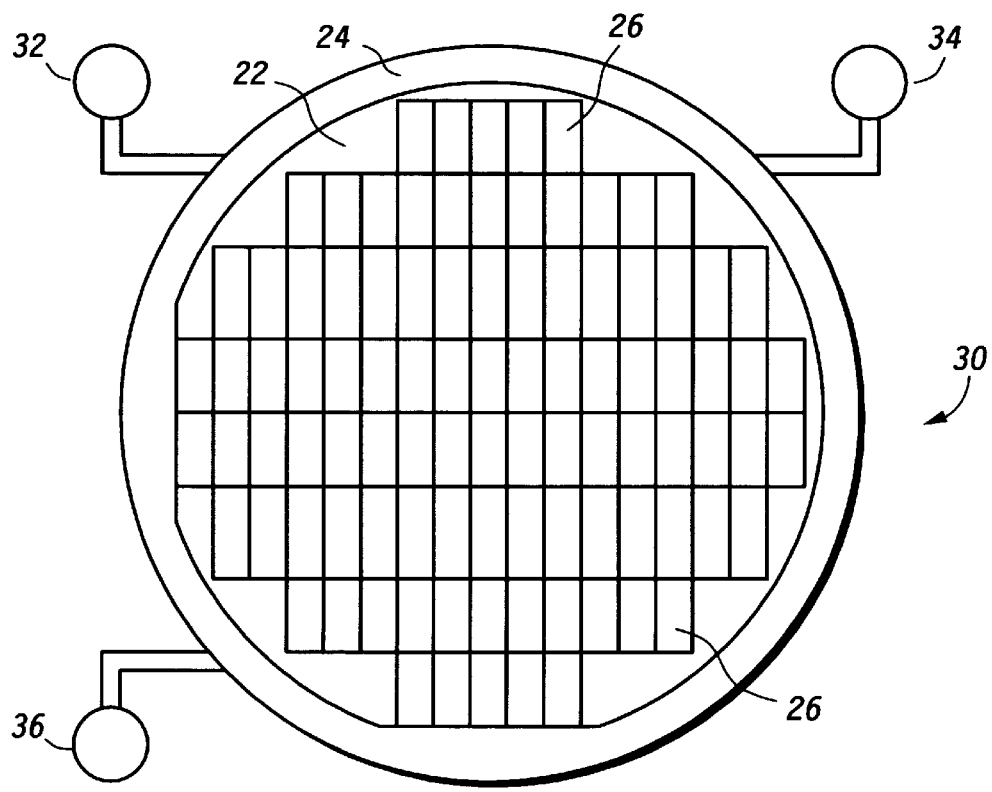
FIG. 2 is a top view of the chuck top in the tester in FIG. 1.

FIG. 2 is a top view of the chuck top in the tester 10 in FIG. 1. A semiconductor wafer 22 comprised of a plurality of die sits on the chuck 24. Attached to the chuck 24 itself are three potential occasions for probe tip parameter measurement. A camera 32 is typically used for alignment. However, it can provide a view of the probe tips and a sensor target at the same time. A probe tip cleaning device 34 is typically used to clean probe tips 20 periodically. It operates by briefly touching the bottoms of the probe tips 20 in a sand paper fashion. This is done at every "N" number of die. Finally, an independent force measurement station 36 can be installed that automatically measures the probe tip 20 force for one or more probe tips 20 at a time. Note that the probe parameter sensor can be integrated into any of these three locations, camera 32, probe tip cleaning device 34, and independent force measurement station 36. In the case of the probe tip cleaning device 34, the act of cleaning probe tips 20 can be integrated into measuring probe tip parameters simultaneously.

Figure 3:
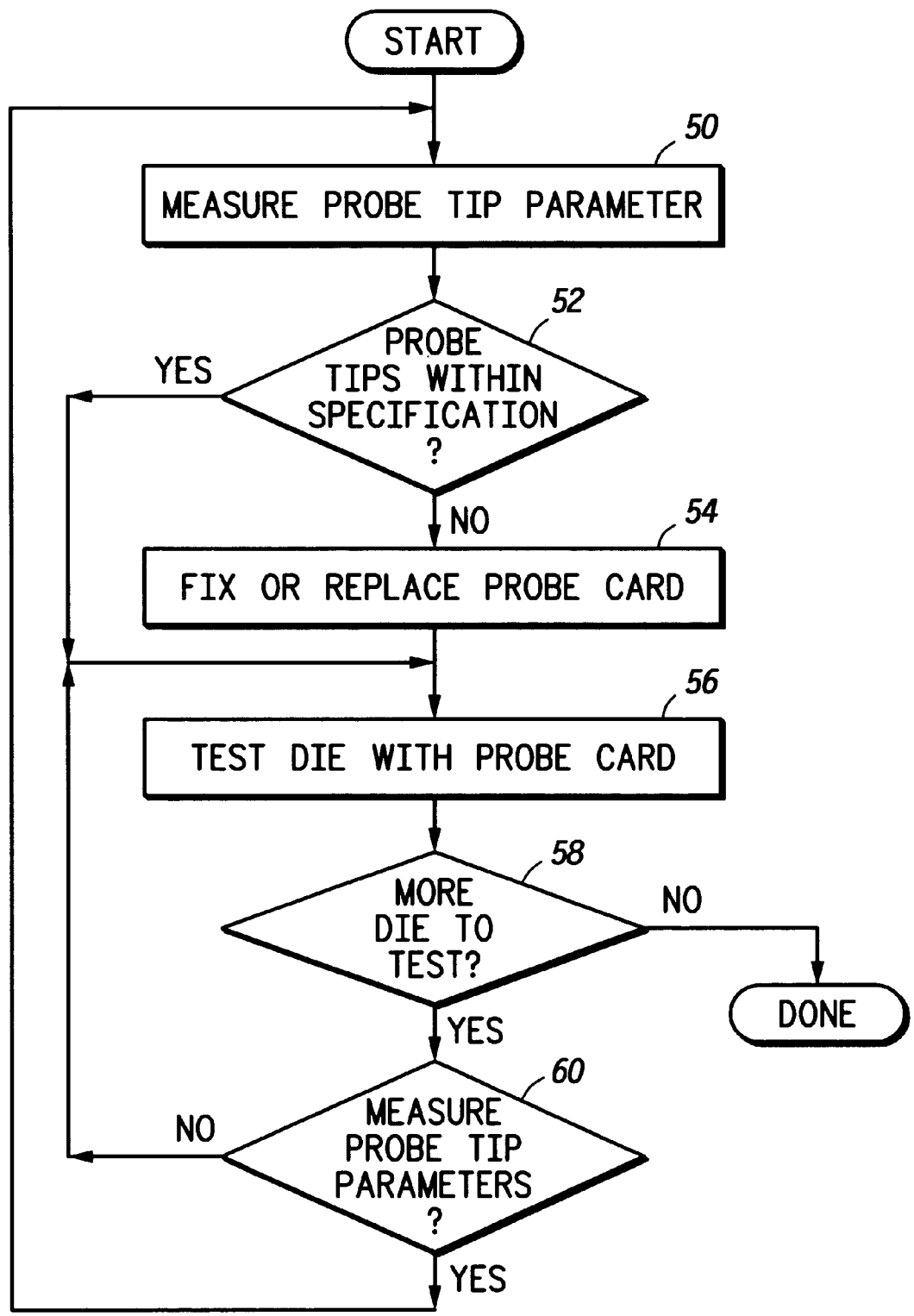
FIG. 3 is a flow chart illustrating application of the present invention.

FIG. 3 is a flow chart illustrating application of the present invention. In the flow chart an inner and outer loop are shown. Starting into the outer loop, probe tip parameters are measured for a given probe card, step 50. First, the probe tip force can be measured either in absolute or relative terms. Absolute force is the actual force exerted by one or more tips on the sensor. Relative force is a delta measurement between one tip and another, or one tip and a standard. Probe tip pressure (force/unit area) can also be tested. Finally, the spring constant of the probe tip can be measured.

Probe tips can either be tested individually, or in a group. Groups may range from two up to all of the probe tips attached to a probe card. Advantages of testing a single probe tip include identifying which probe tip attached to a probe card is posing a failure. One advantage of testing all probe tips attached to a probe card simultaneously is the savings in time where the individual force is derived from dividing the total probe tip force by the number of probe tips making full contact. Likewise, an average spring constant can be found from dividing by the probe tips' compressed "Z" height.

After the probe tip parameter has been measured, step 50, a test is made whether the probe tip or tips are within specification, step 52. If not within specification, step 52, the probe card can be either fixed or replaced, step 54. In any case, a die on a substrate or wafer is tested with the probe card, step 56. A measurement is then made whether there are more die to test, step 58. If no more die remain to be tested, step 58, the process is complete. Otherwise, a measurement is made whether to measure probe tip parameters, step 60. Probe tip parameters can be measured for example on a per substrate or wafer basis, or on a lot basis, or after a certain number of die have been probed or tested. Indeed, it is possible to dynamically adjust the testing frequency of measuring probe tip parameters by the characteristics measured in step 50. If it is not yet time to measure probe tip parameters, step 60, the next die is tested with the probe card, step 56. Otherwise, the probe tip parameter for the probe card is measured, step 50, before entering into the inner loop.

FIG. 4 is an isometric view of force sensor or gauge 70. Currently, the force sensor 70 is accurate to a tenth of a gram. This is sufficiently accurate for the purposes described herein. However, it is envisioned that this accuracy will improve over time. The force sensor 70 has an arm 72, and a shim 74 attached to the arm 72 with a plate 76. The shim 74 has a raised section 78. Shims 74 can vary in width, with the width selected determined by the number of probe tips 20 to test simultaneously. Typically, each of the shims has a width in a range of approximately 50–1,250 microns. There is also a full tip contact pad 84 for measuring the force of all of the tips 20 attached to a probe card 18. Note that the implementation of the force sensor 70 shown can be used with a camera 32. However, in the case of the integrated probe tip cleaning device 34, no arm 72 would be necessary, rather just the full tip contact pad 84. Especially in the case of a force sensor 70 for measuring all of the probe tips 20 at a single time, other equivalent configurations and designs are possible.

Because the measurement of force in this application is only measured in compression, a uni-directional force sensor 70 or load cell is sufficient. Preferably, the force sensor 70 is accurately mounted such that the direction of applied load is within the same axis of the sensor's measurement axis. Preferably, the force sensor 70 has a nonlinearity, hysteresis, and nonrepeatability of +/−0.02%. Typically, a force sensor 70 that makes use of a "4-arm strain-gage bridge" to convert a strain to a voltage allows for these values to be achieved. Futek Advanced Sensor Technology, Inc. (26052 Merit Circle, Suite 103, Laguna Hills, Calif. 92653) is a company that is able to provide sensors within these operating specifications. Preferably, the force sensor 70 utilized should also be able to operate within the temperature range of −20° C. to 90° C.

FIG. 5 is a camera view of the force sensor 70 and probe tip contacts 82 that are the contact ends of probe tips 20. The force sensor 70, arm 72 contains the shim 74. At the end of the shim 74 is a tip or raised surface 78. The shim's raised surface 78 engages probe tip contact 82, when moved in a "Z" or vertical direction, moves the probe tip contact 82. Resistance to this movement is then measured by the force sensor 70.

FIG. 6 shows a macro view of a probe tip contact 82 and shim 74 contact scenario from FIG. 4. The shim 74 has a tipped or raised surface 78. It is supported by the arm 72. Note that raised surface 78 has a surface that is substantially parallel to the top surface of the arm (body) 72. The elevational different between the raised surface and the top surface is in a range of approximately 50–500 microns. When the sensor 70 moves up in a vertical or "Z" direction, the raised surface 78 engages and depresses the probe tip contact 82 deflecting the probe tip 20 upward. The absolute relative resistance of the probe tip contact 82 to movement induced by the raised surface 78 can be measured, and this measure can be used to accomplish the objectives of the measuring probe tip behavior under load.

Figure 7:
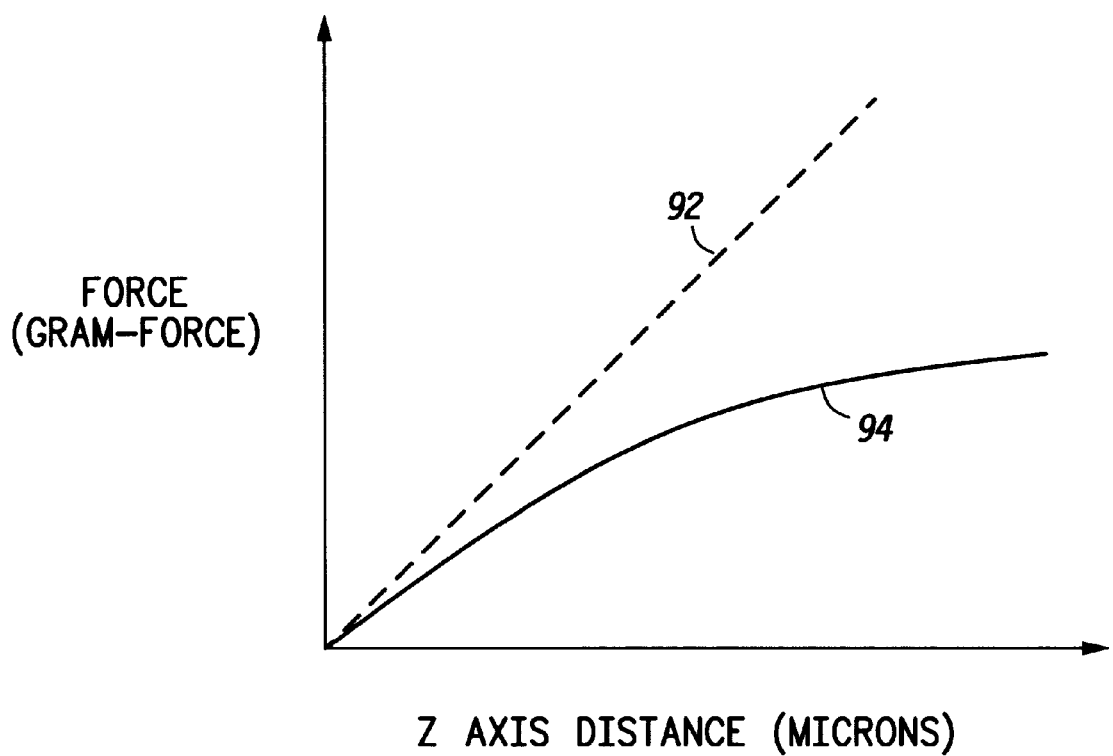
FIG. 7 is a graph illustrating an example of the probe tips' spring relationship.

FIG. 7 is a graph illustrating an example of the probe tips' 20 spring relationship. The vertical axis or dimension denotes force in gram force units and the horizontal axis is the "Z" axis distance in, for example, microns. The dotted straight line 92 is the ideal linear force spring behavior line. It illustrates how a new spring should react to the application of force. Theoretically, the more distance that is traversed, the more force has been applied. As illustrated, the relationship is theoretically linear. However, this is just an approximation. The solid line curve 94 is an example of deteriorated force/spring behavior. For example, as a spring is overstressed or fatigued, the relationship between distance and force may become non-linear, or the slope may change wile remaining home. The slope of lines 92 and 94 in FIG. 7 are the spring rates.

One example of how the data in FIG. 7 can be used is to trend the life of probe tips 20. For example, probe tips 20 can be tested periodically, for example after each wafer, after every lot, or after "N" number of die. The probe height distance can be adjusted based on the decay shown in solid line curve 94. Also, actual data for a set of probe tips 20 can be compared with expected values, and the lifetime of a probe card 18 determined from such. This data can also be used to decrease the deformation created on the bond pads or bumps by the physical contact of the probe tips 20. This data can also be tied in or integrated with electrical data such as contact resistance between the probe tips 20 and wafer metallurgy.

Those skilled in the art will recognize that modifications and variations can be made without departing from the spirit of the invention. Therefore, it is intended that this invention encompass all such variations and modifications as fall within the scope of the appended claims.

What is claimed is:

1. A method of testing semiconductor devices comprising:
   providing a testing system with a measurement station, a substrate, a substrate holder and a probe card, wherein:
   the substrate lies along a surface of the substrate holder;
   the substrate includes a first plurality of the semiconductor devices;
   the measurement station is attached to the substrate holder and is spaced apart from the substrate and the probe card; and
   the probe card has probe tips;
   measuring a probe tip parameter of at least one probe tip for a first time at the measurement station while within the testing system, wherein the probe tip parameter is selected from a group consisting of Z-axis distance, force, spring rate, and pressure; and
   testing the first plurality of the semiconductor devices while they are on the substrate holder, wherein the testing is performed before or after the measuring.

2. The method of claim 1, wherein:
   the testing of the first plurality of the semiconductor device is performed before the measuring; and the method further comprises testing a second plurality of the semiconductor devices after the measuring, wherein the first and second plurality of the semiconductor devices belong to different substrates in a same production lot.

3. The method of claim 1, wherein:

the measuring the probe tip parameter for the first time is performed before the testing the first plurality of the semiconductor devices; and the method further comprises:

measuring the probe tip parameter of the at least one probe tip for a second time while within the testing system, wherein this measuring is performed after the testing of the first plurality of the semiconductor devices; and determining whether the probe tip parameter is within a specified limit.

4. The method of claim 3, further comprising testing a second plurality of the semiconductor devices after the determining.

5. The method of claim 1, wherein:

the measuring the probe tip parameter for the first time is performed after the testing the first plurality of the semiconductor devices; and the method further comprises testing a second plurality of the semiconductor devices after the measuring.

6. The method of claim 1, wherein the measuring the probe tip parameter comprises measuring a probe tip parameter of no more than five probe tips of the probe card simultaneously.

7. The method of claim 1, wherein the measuring the probe tip parameter comprising measuring a probe tip parameter of all probe tips of the probe card simultaneously.

8. The method of claim 1, wherein:

the measuring comprises comparing Z-axis distance and force; and the method further comprises repairing or replacing the probe card if a relationship between Z-axis distance and force is significantly non-linear.

9. The method of claim 1, wherein:

the testing system includes a first set of probe tips and a second set of probe tips;

the method further comprises cleaning performed using the second set of probe tips; and measuring the first set of probe tips, is performed simultaneously with the cleaning.

10. The method of claim 1, wherein the providing comprises providing a testing system having a force gauge for measuring the probe tip parameter.

11. The method of claim 10, wherein the measuring comprises measuring a probe tip parameter of all probe tips simultaneously using the force gauge.

12. The method of claim 10, wherein:

the providing comprises providing a testing system having a force gauge that includes a raised surface; and the measuring comprises contacting at least one of the probe tips with the raised surface.

13. The method of claim 12, wherein the measuring comprises contacting a plurality of probe tips but not all the probe tips of the probe card.

14. The method of claim 1, wherein the providing comprises providing a testing system having a force gauge that includes a raised surface and a body with a top surface, wherein:

the raised surface lies along a first plane;

the top surface lies along a second plane that is substantially parallel with the first plane; and an elevational difference between the raised surface and top surface is at least approximately 50 microns.

15. The method of claim 1, wherein the providing comprises:

providing a testing system having a force gauge that includes a raised surface and a body with a top surface, wherein:

the raised surface lies along a first plane;

the top surface lies along a second plane that is substantially parallel with the first plane; and an elevational difference between the raised surface and top surface is in a range of approximately 50–500 microns.

16. The method of claim 1, wherein:

the providing comprises providing a testing system having a force gauge that includes a shim that has a width in a range of approximately 50–1,250 microns; and the measuring comprises contacting the at least one probe tip and the width of the shim.

17. The method of claim 1, wherein the at least one probe tip is selected from a group consisting of cantilever probe tips, cobra probe tips, membrane probe tips.

\* \* \* \* \*